United States Patent
Chiu et al.

(10) Patent No.: US 7,339,202 B2
(45) Date of Patent: Mar. 4, 2008

(54) BACKLIGHT MODULE AND A LIGHT-EMITTING-DIODE PACKAGE STRUCTURE THEREFOR

(75) Inventors: Tien-Lung Chiu, Kaohsiung (TW); Wei-Yang Tseng, Hsinchu (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/162,724

(22) Filed: Sep. 21, 2005

(65) Prior Publication Data

US 2007/0063210 A1    Mar. 22, 2007

(51) Int. Cl.
*H01L 29/24* (2006.01)
*H01L 33/00* (2006.01)

(52) U.S. Cl. .................. 257/100; 257/98; 257/99; 257/E33.059; 257/E33.058

(58) Field of Classification Search .............. 257/98, 257/99
See application file for complete search history.

(56) References Cited

U.S. PATENT DOCUMENTS

| | | | |
|---|---|---|---|
| 6,679,621 B2 | 1/2004 | West et al. | 362/327 |
| 6,972,439 B1* | 12/2005 | Kim et al. | 257/98 |
| 2004/0207999 A1* | 10/2004 | Suehiro et al. | 362/84 |
| 2005/0168987 A1* | 8/2005 | Tamaoki et al. | 362/244 |
| 2005/0225988 A1* | 10/2005 | Chaves et al. | 362/332 |
| 2005/0265046 A1* | 12/2005 | Liu | 362/606 |
| 2005/0285133 A1* | 12/2005 | Hung | 257/99 |

* cited by examiner

*Primary Examiner*—Evan Pert
*Assistant Examiner*—Ben P Sandvik
(74) *Attorney, Agent, or Firm*—Jianq Chyun IP Office (57) ABSTRACT

The LED package structure includes a substrate, an LED chip, a plastic package body, and two leading legs. In addition, the LED chip is arranged on the substrate and covered by the packaging plastic body. Moreover, the plastic package body contains a light-converging part and a light-scattering part, in which the light-converging part has a first axis and the light-scattering part has a second axis. In addition, the first axis of the light-converging part intersects the second axis of the light-scattering part. Furthermore, one terminal of each of the two leading legs is electrically connected to the LED chip while another terminal extends out of the packaging plastic body. Because the LED package structure can converge light and scatter light in different directions, the backlight module implementing the LED package structure has the advantage of a shorter light-mixing distance and better light utilization.

20 Claims, 9 Drawing Sheets

BACKLIGHT MODULE AND A LIGHT-EMITTING-DIODE PACKAGE STRUCTURE THEREFOR

BACKGROUND OF THE INVENTION

1. Field of the Invention

The present invention generally relates to a light-emitting device, and more particularly, to a backlight module and a light-emitting-diode (LED) package structure therefore.

2. Description of Related Art

A backlight module is usually classified into a side type and a direct type, wherein the side type requires a light-guiding plate to convert a linear light source into a planar light source required by a liquid crystal display (LCD) panel. In addition, because the LEDs have the advantages of higher color saturation, mercury-free material, higher lifespan, a lower operating temperature, and a variable color adjustment by a driven current, an LED array has gradually been implemented in the backlight module.

Figure 1A:
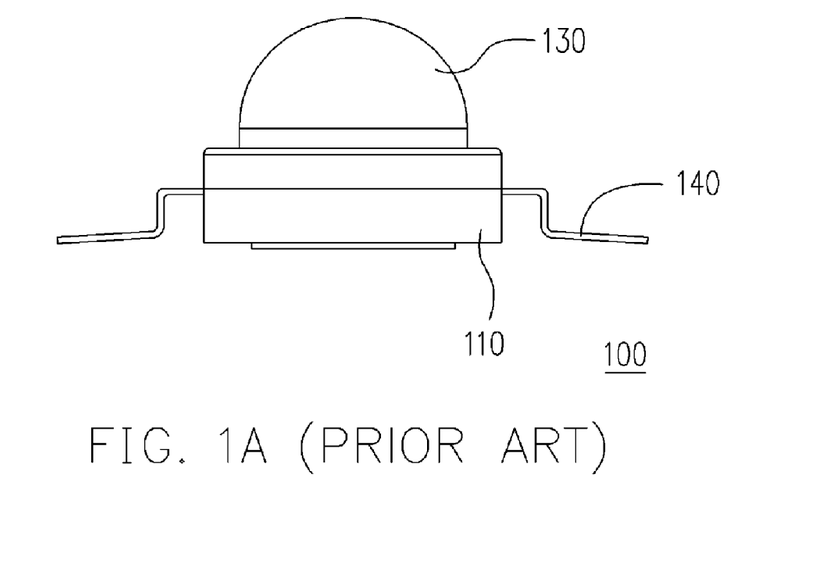
FIGS. 1A, 2A, and 3A respectively shows cross-sectional views of conventional Lambertian, Batwing, and side-type LED package structures.
Figure 1B:
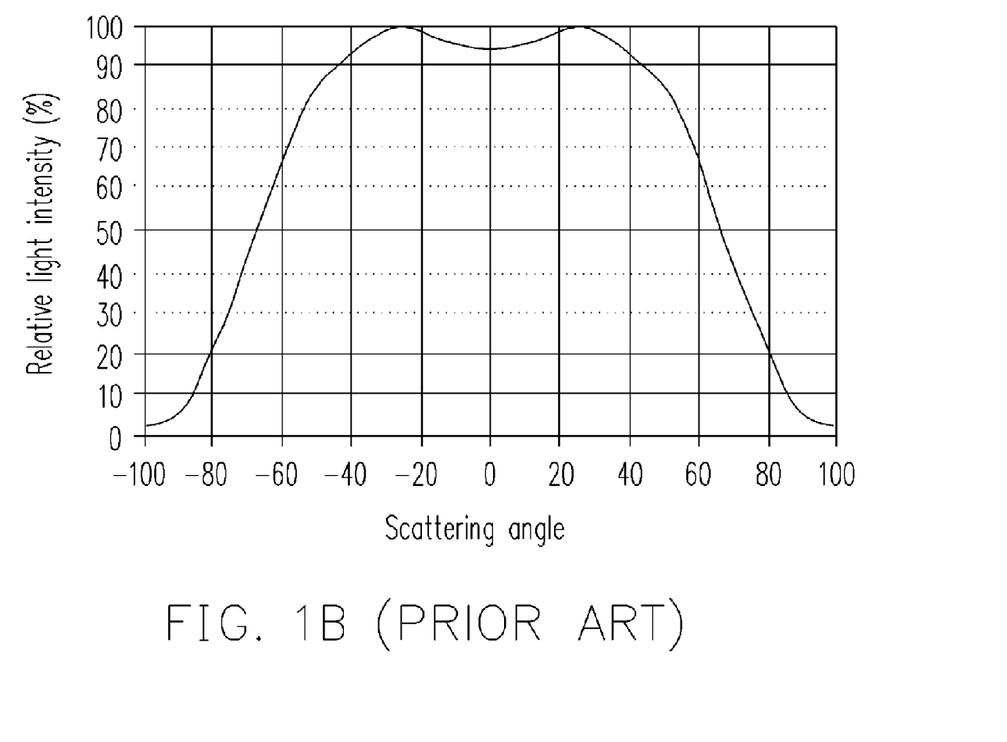
FIGS. 1B, 2B, and 3B respectively shows relationship between light intensity and scattering angles of LED package structures shown in FIGS. 1A, 2A, and 3A.
Figure 2A:
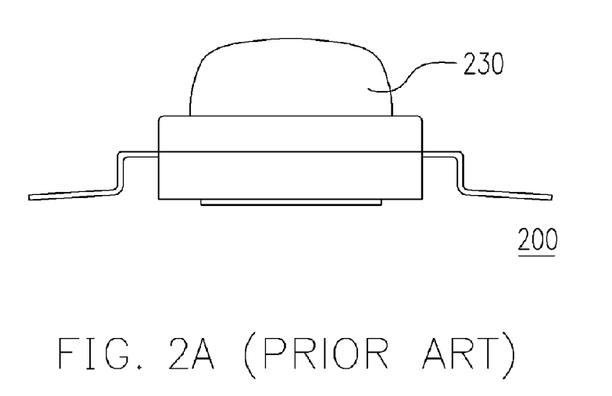
Figure 2B:
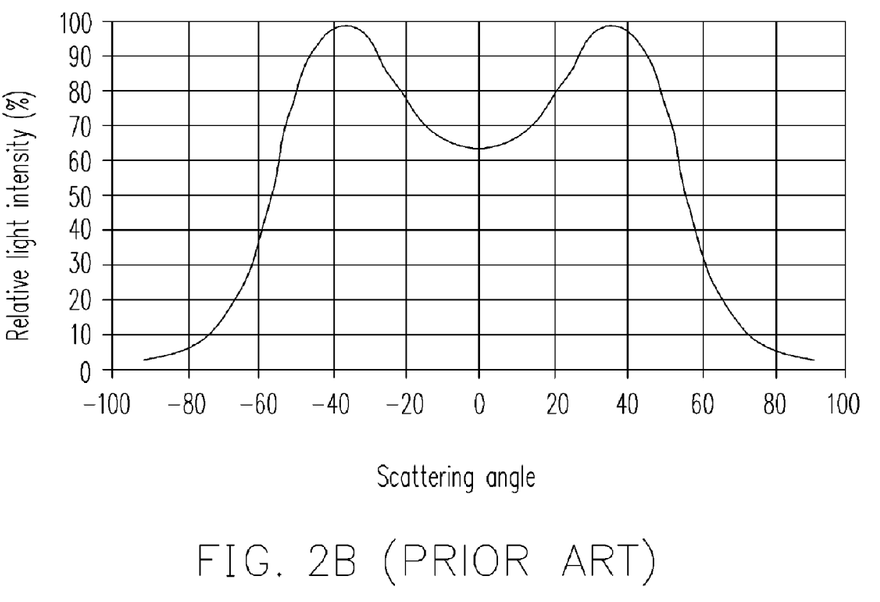
Figure 3A:
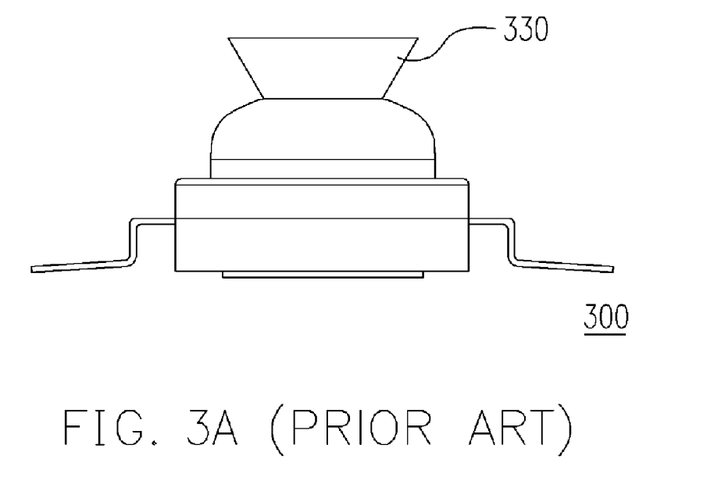

FIGS. 1A, 2A, and 3A respectively shows cross-sectional views of conventional Lambertian, Batwing, and side-type LED package structures. Moreover, FIGS. 1B, 2B and 3B respectively shows the relationship between the light intensity and scattering angles of the LED package structures shown in FIGS. 1A, 2A, and 3A.

Referring to FIG. 1A, the conventional Lambertian type LED package structure 100 comprises a substrate 110, an LED chip (not shown), a plastic package body 130, and two leading legs 140. In addition, the LED chip is disposed on the substrate 110 and covered by the plastic package body 130. Furthermore, the LED chip is electrically connected to one terminal of each of the leading legs 140 and accordingly electrically connected to other electronic components (not shown) through the terminal.

Referring to FIG. 2A, the conventional Batwing LED package structure 200 differs from the conventional Lambertian LED package structure 100 in that the plastic package body 130 of the Lambertian LED package structure 100 is of a hemispherical dome-shape (typically referred to as high dome), while the plastic package body 230 of the Batwing LED package structure 200 has a substantially hemispherical dome shape, but with a more planar top (typically referred to as low dome). Moreover, the plastic package body 330 of the side-type LED package structure 300, shown in FIG. 3A, usually has a funnel shape.

Figure 3B:
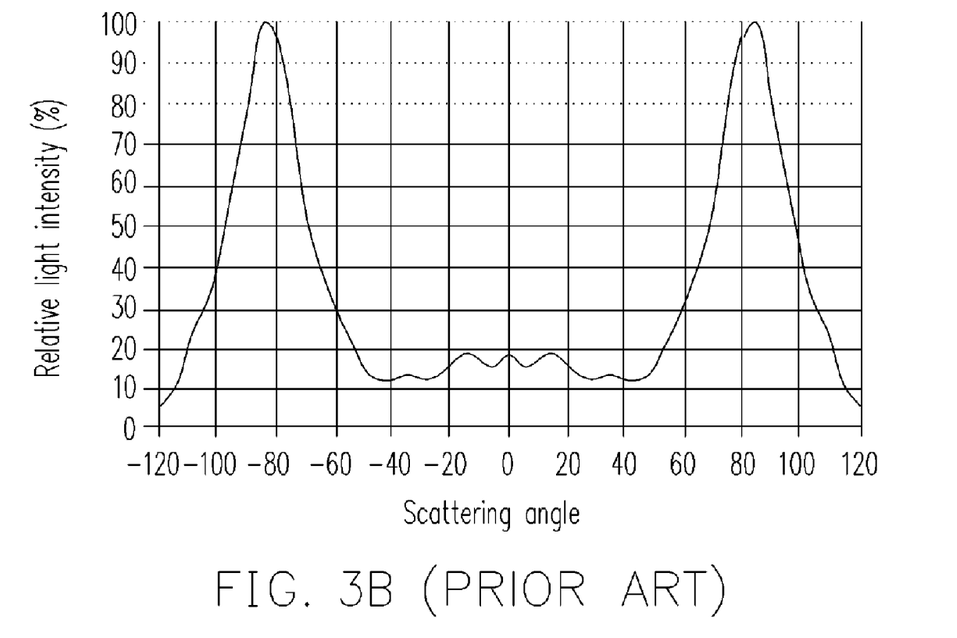

In comparison of these LED package structures as shown in FIGS. 1B, 2B, and 3B, light emitting from the Lambertian LED package structure 100 and the Batwing LED package structure 200 are more converged. Therefore, currently, most side-type backlight modules adopt Lambertian or Batwing LED package structure as a light source, which is briefly described in the following.

Figure 4:
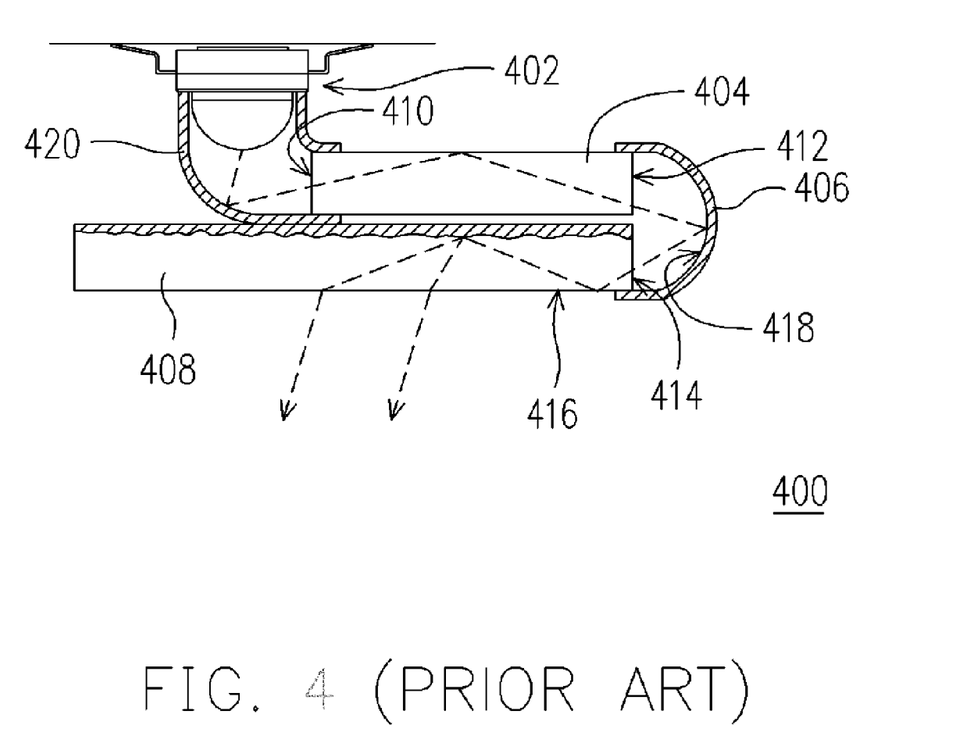
FIG. 4 shows a side cross-sectional view of a conventional side-type backlight module.

FIG. 4 shows a side cross-sectional view of a conventional side-type backlight module. Referring to FIG. 4, the conventional side-type backlight module 400 comprises a plurality of LED package structures 402 (FIG. 4 only shows one of these LED package structures 402) and a light-guiding plate 408. In addition, since light emitting from the LED package structures 402 is more converged, the backlight module 400 is usually added with a light-mixing element 404 so as to elongate a light-mixing distance of the LED package structures 402 and further to allow the backlight module 400 to provide uniformly mixed light.

Referring to FIG. 4, the LED package structure 402 is disposed close to a light incident cross section 410 of the light-mixing element 404. In addition, the light emitting from the LED package structures 402 is reflected into the light-mixing element 404 by using a light-emitting cross section of a emitting plate 420 attached to the LED package structures 402 and the light incident cross section 410 of the light-mixing element 404. Meanwhile, light emitting from the LED package structures 402 is then mixed in the light-mixing element 404 and emits through a light-emitting cross section 412 thereof, as well as into a light-converting element 406 connected between the light-mixing element 404 and the light-guiding plate 408. After that, light is reflected by the inner emitting surface 418 of the light-converting element 406 and passes through a light incident cross section 414 into the light-guiding plate 408. Eventually, the light emitting from a light-emitting cross section 416 of the light-guiding plate 408, provides the LCD panel with the light source.

From the preceding description, this type of backlight module requires a longer light-mixing distance for uniform mixing of the light emitting from the LED. Therefore, an integrated backlight module also requires a larger size. As a result, in today's trend of minimized display products, such a conventional backlight module is considerably limited in its applications.

SUMMARY OF THE INVENTION

Accordingly, the present invention is directed to a light-emitting-diode (LED) package structure capable of providing light-converging and light-scattering functions in all directions.

In addition, the present invention is further directed to a backlight module implementing the aforementioned LED package structure as a light source to provide a light of uniform chroma and brightness. Moreover, this backlight module is suitable for a lighter and thinner panel display due to its lower-volume and lighter-weight in comparison with the conventional backlight module.

An LED package structure of the present invention comprises a substrate, a LED chip, a plastic package body, and two leading legs. In addition, the LED chip is arranged on the substrate and covered by the packaging plastic body. Moreover, the plastic package body comprises a light-converging part and a light-scattering part, wherein the light-converging part has a first axis and the light-scattering part has a second axis. Furthermore, the first axis intersects the second axis, and one terminal of each of the two leading legs is electrically connected to the LED chip.

A backlight module of the present invention comprises a light-guiding element and a plurality of the aforementioned LED package structures, wherein the light-guiding element comprises a light incident surface and a light emitting surface. In addition, these LED package structures are electrically connected to a printed circuit board through the leading legs, and arranged close to a light incident surface of the light-guiding element. In addition, the first axis of the light-converging part of the plastic package body is perpendicular to the light incident surface of the light-guiding element.

In one embodiment of the present invention, the light-emitting surface of the light-converging part of the plastic package body may, for example, incline relative to the second axis. For example, the light-converging part may have a funnel shape.

In one embodiment of the present invention, the light emitting from the light-converging part of the plastic package body may be perpendicular to the second axis, for example.

In one embodiment of the present invention, a spatial radiation pattern of the light-converging part of the plastic package body may be a Lambertian or Batwing type, for example.

In one embodiment of the present invention, the LED chip may comprise a red light LED chip, a green light LED chip, or a blue light LED chip.

In one embodiment of the present invention, the light-guiding element may be, for example, a light-guiding plate. Moreover, the light-guiding plate may have a wedge shape, for example.

In one embodiment of the present invention, the light-guiding element comprises a light-scattering surface disposed opposite to the light-emitting surface. Furthermore, in another embodiment, the backlight module further comprises a reflective plate disposed underneath the light-scattering surface.

In one embodiment of the present invention, the backlight module further comprises a reflective mask which masks the light incident surface of the light-guiding element 620 because it is attached on an inner surface of the reflective mask. In addition, the LED package structure is disposed between the reflective mask and the light-guiding element.

In one embodiment of the present invention, the first axis and the second axis of the LED package structure of the present invention, are perpendicular each other.

The LED package structure of the present invention can provide light-converging and light-scattering functions in all axes, and in comparison with the conventional single LED package structure's light-converging or light-scattering functions, the LED package structure of the present invention can have a wider application. Especially in the field of backlight module, the LED package structure of the present invention applied as a light-emitting element could not only provide more uniform light-mixing in a shorter distance but also reduce the backlight module size, thus promoting light utilization of the backlight module.

The objectives, other features, and advantages of the invention will become more apparent from the following detailed description of the invention when taken in conjunction with the accompanying drawings.

DESCRIPTION OF THE EMBODIMENTS

Reference will now be made in detail to the present embodiments of the invention, examples of which are illustrated in the accompanying drawings. Wherever possible, the same reference numbers are used in the drawings and the descriptions to refer to the same parts.

Figure 5A:
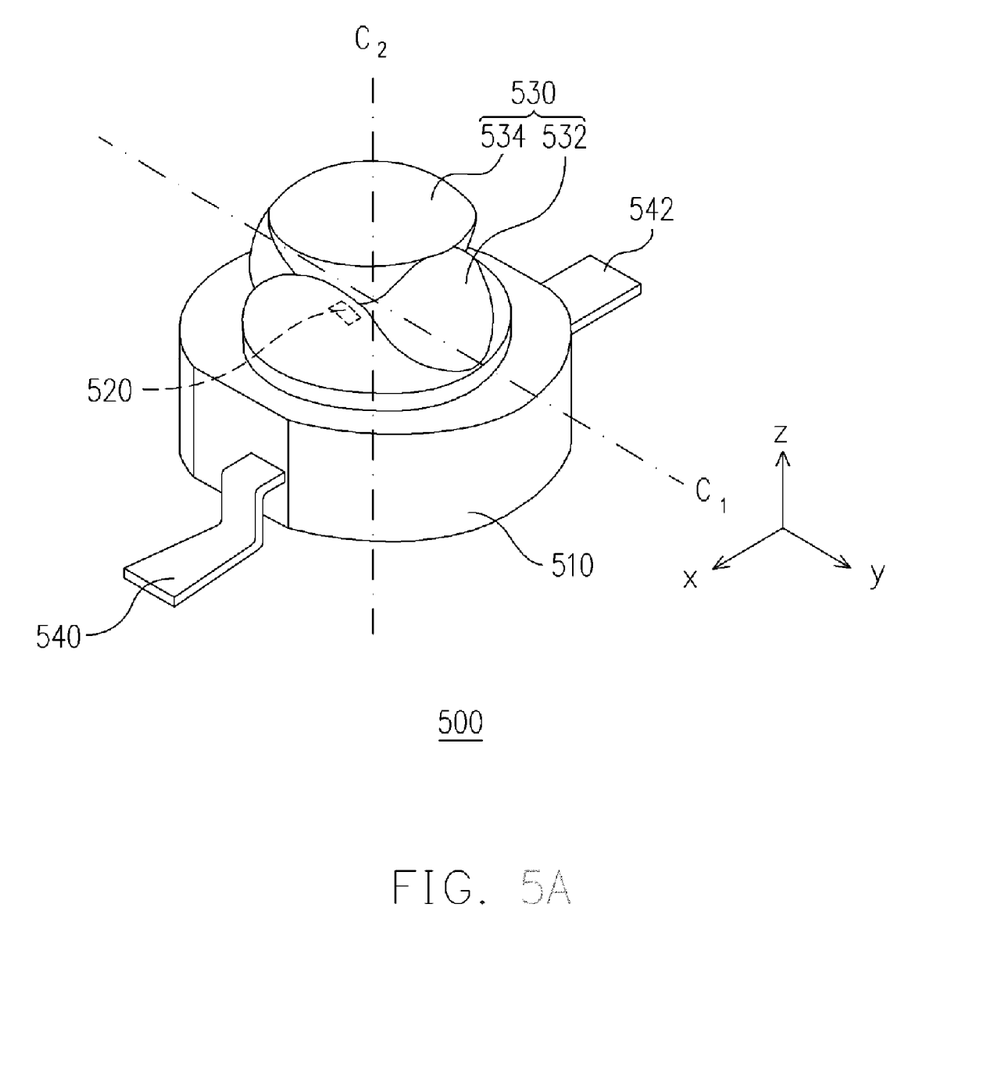
FIG. 5A shows a three-dimensional view of a LED package structure of the present invention.

FIG. 5A shows a three-dimensional view of an LED package structure of the present invention. Whereas, FIGS. 5B and 5C respectively shows side views of the LED package structure in FIG. 5A from different axes. As shown in FIG. 5A, an LED package structure 500 comprises a substrate 510, an LED chip 520, a plastic package body 530, a first leading leg 540, and a second leading leg 542. In addition, the LED chip 520 is arranged on the substrate 510 and may comprise a red light LED chip, a green light LED chip or a blue light LED chip.

Furthermore, the plastic package body 530 is also disposed on the substrate 510 and covers the LED chip 520. Especially, the plastic package body 530 comprises a light-converging part 532 and a light-scattering part 534, wherein a first axis $C_1$ of the light-converging part 532 intersects a second axis $C_2$ of the light-scattering part 534, and preferably, the first axis $C_1$ is perpendicular to the second axis $C_2$.

Referring to FIG. 5A, the first axis $C_1$ of the light-converging part 532 may be parallel to the y-axis, while the second axis $C_2$ of the light-scattering part 534 may be parallel to the z-axis. In addition, referring to FIG. 5B, a profile of the light-scattering part 534 may be identical to that of a plastic package body 330 of a side-type LED package structure 300 shown in FIG. 3A. In other words, a light-emitting surface 535 of the light-scattering part 534 may, for example, incline relative to the second axis $C_2$. In a more detailed explanation, the light-scattering part 534 of the plastic package body 530 may have, for example, a funnel shape; and the light emitting from the light-scattering part 534 may be, for example, perpendicular to the second axis $C_2$.

Figure 5B:
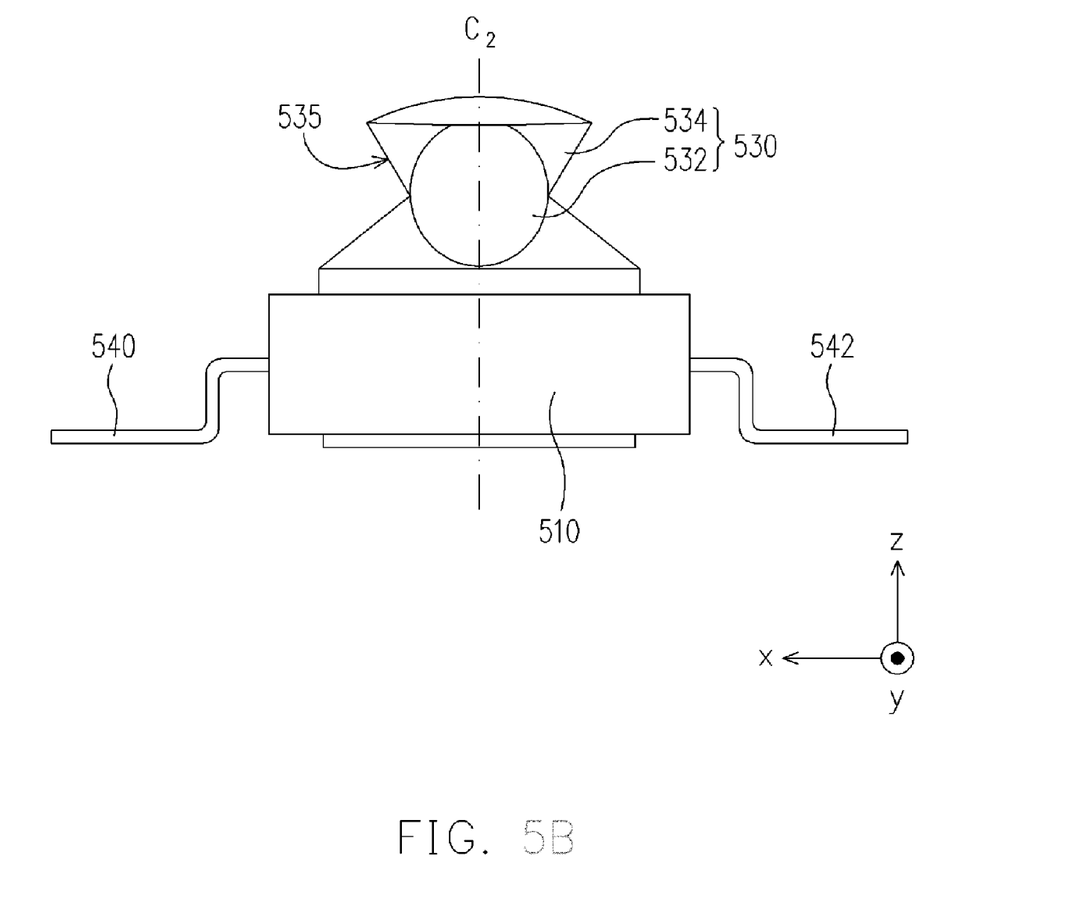
FIGS. 5B and 5C respectively shows side views of the LED package structure in FIG. 5A from different axes.

Note that, in another embodiment of the present invention, the light-scattering part 534 may have the same profile as the lens of an LED package structure disclosed in U.S. Pat. No. 6,679,621. However, profiles of the light-scattering part 534 of the present invention are not limited thereto, provided that the ability of emitting light is given.

Figure 5C:
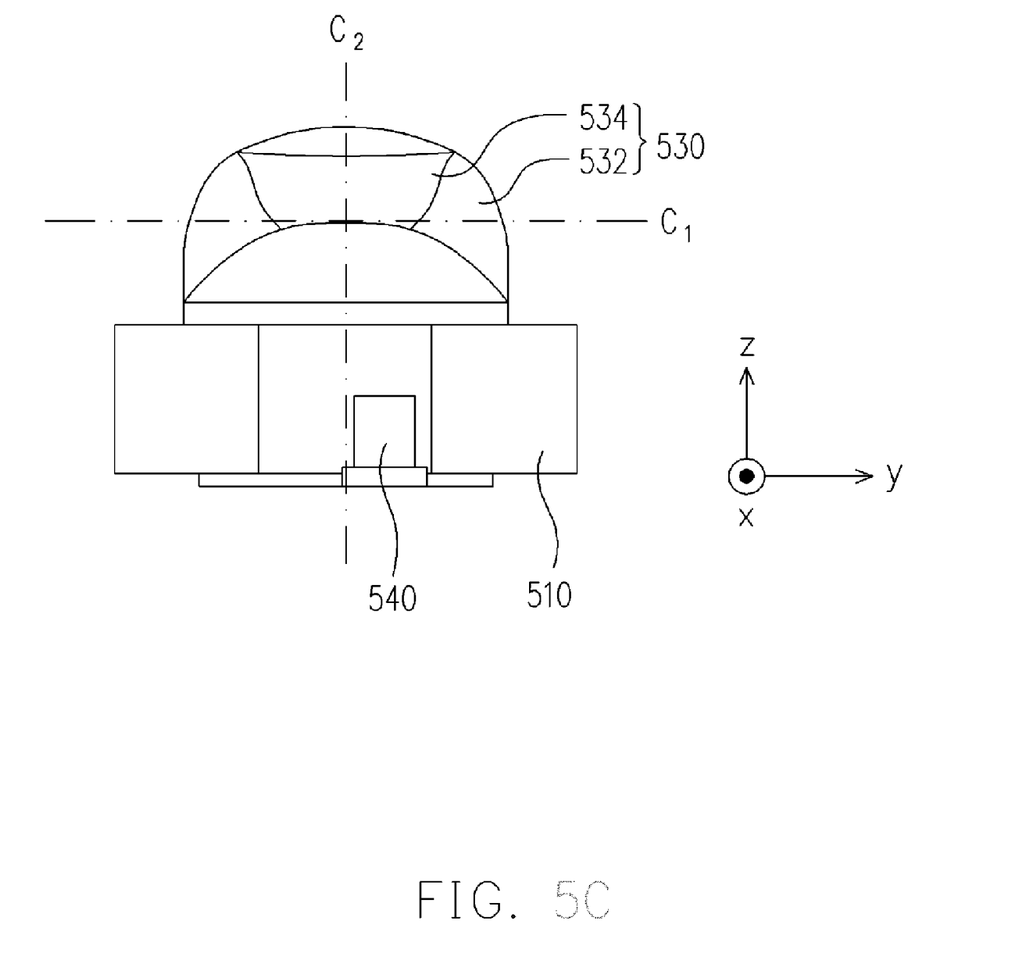

Referring to FIG. 5C, the profile of the light-converging part 532 is similar to that of FIG. 1A's plastic package body 130 or FIG. 2A's plastic package body 230. In other words, light-converging part 532's light distribution can be characterized as either Lambertain or Batwing type. Similarly, under the premise of light-converging ability, the invention does not specify the profile for the light converging part 532.

Referring to FIG. 5A again, the first terminals of the first leg 540 and the second leg 542 are electrically connected to the LED chip 520. In more detailed description, terminals of the first leg 540 and the second leg 542 are respectively electrically connected to the anode and the cathode of the LED chip 520 (not shown), while the other terminals are used to electrically connect the LED chip 520 to other electronic components, such as a printed circuit board (not shown).

Based upon the preceding description, the LED package structure 500 comprises the first axis $C_1$ for converging the light and the second axis $C_2$ for scattering the light. In other words, the LED package structure of the present invention has light converging and light scattering functions at the same time. As an example, the following describes a backlight module that implements this LED package structure as a light-emitting element.

Figure 6A:
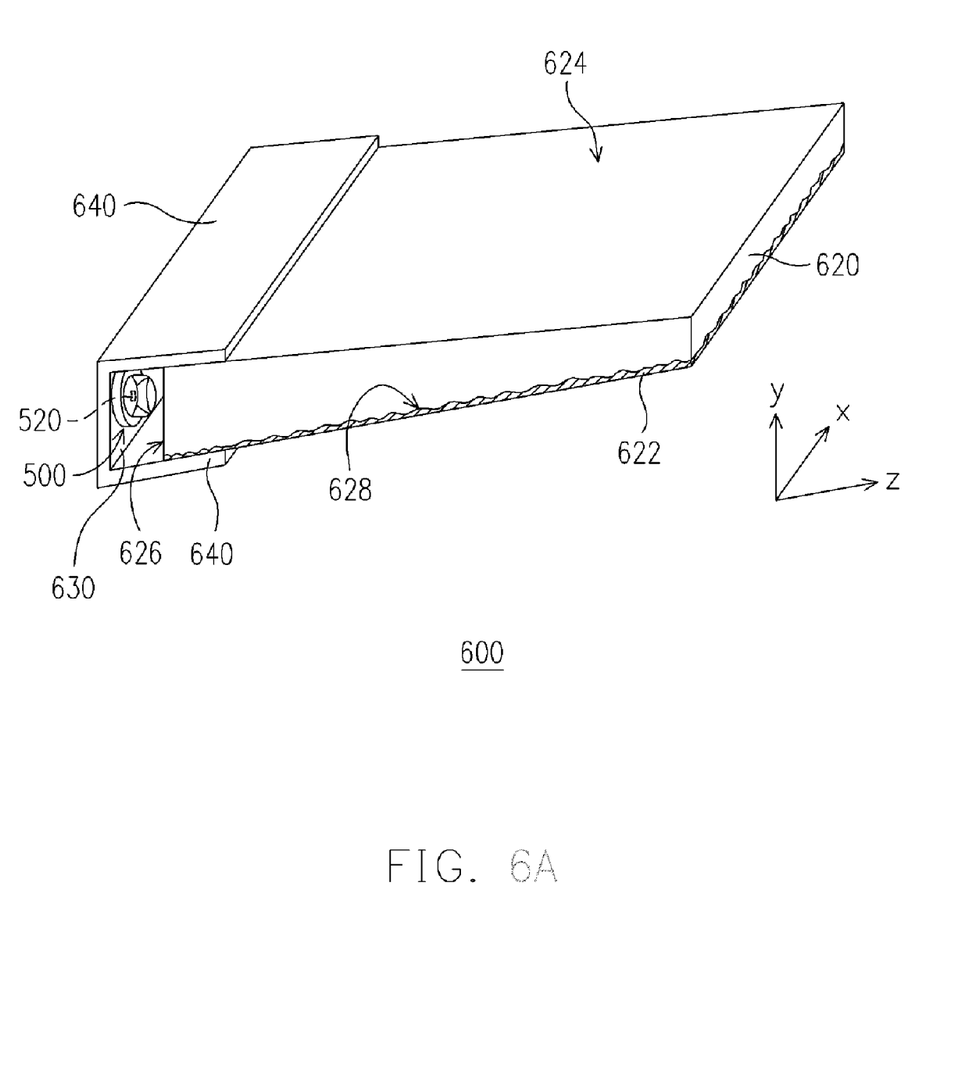
FIG. 6A shows a three-dimensional view of a backlight module according to one embodiment of the present invention.
Figure 6B:
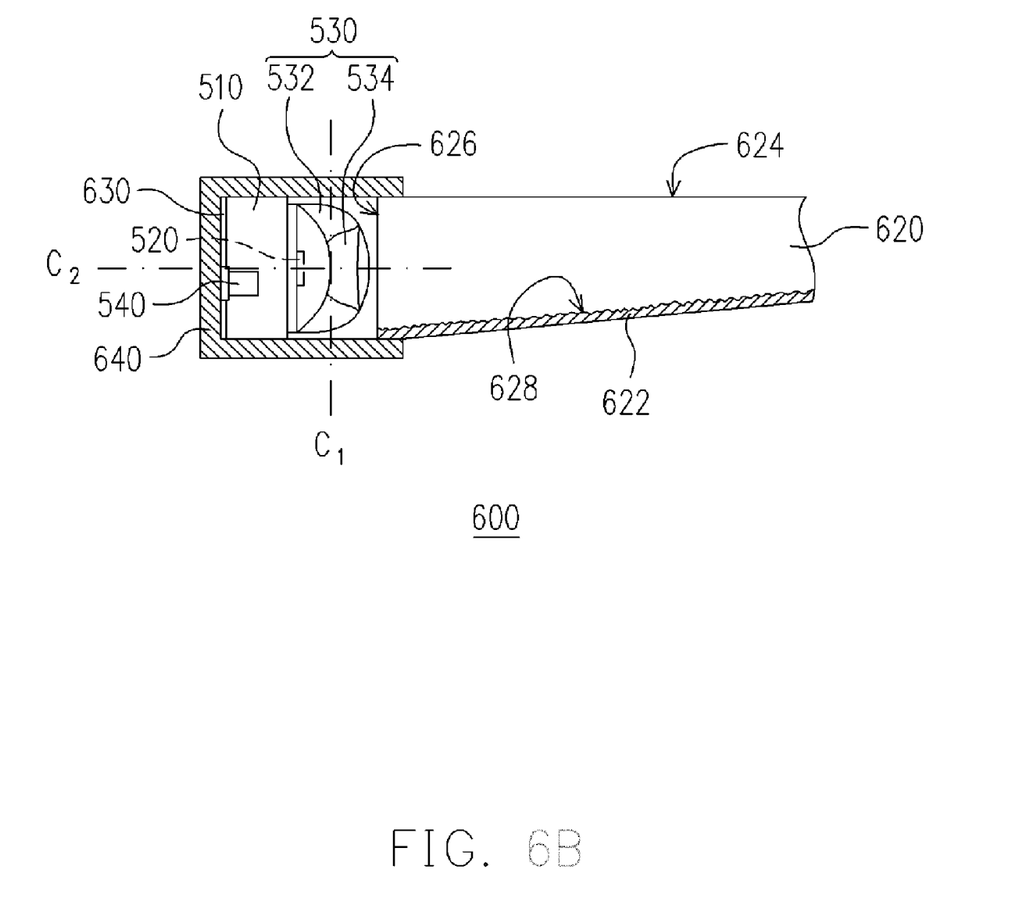
FIG. 6B shows a cross-sectional view of the backlight module shown in FIG. 6A.

FIG. 6A shows a three-dimensional view of a backlight module according to another embodiment of the present invention, and FIG. 6B shows a cross-sectional view of the backlight module of FIG. 6A. Referring to FIGS. 6A and 6B, a backlight module 600 comprises a plurality of LED package structures 500 (only one is shown in FIGS. 6A and 6B) and a light-guiding element 620. In addition, the light-guiding element 620 comprises a light incident surface 626 and a light-emitting surface 624, and the package structure 500 is electrically connected to a printed circuit board 630 through the first leg 540 and the second leg 542 (not shown) and arranged close to the light incident surface 626 of the light-guiding element 620.

Note that in the backlight module 600, the first axis $C_1$ of the light converging part 532 of the LED package structure 500 is perpendicular to the light-emitting surface 624 of the light-guiding element 620. Therefore, the light emitting from the LED package structure 500 is more converged in the y-axis in FIG. 6A so as to increase light energy incident to the light-guiding element 620. On the other hand, the second axis $C_2$ of the light converging part 532 of the LED package structure 500 is perpendicular to the light incident surface 626 of the light-guiding element 620. That is, the second axis $C_2$ is parallel to the z-axis in FIG. 6A. Namely, the light emitting from the LED package structure 500 is uniformly mixed in a shorter distance in the x-axis.

In addition, in one embodiment, the light-guiding element 620 may be, for example, a light-guiding plate and preferably have a wedge-shaped light-guiding plate. Besides, the light-guiding element 620 may further comprise a light-scattering surface 628 disposed opposite to the light-emitting surface 624 to allow the light to be scattered into the light-guiding element 620 and then uniformly emit through the light-emitting surface 624. In addition, a reflective plate 622 is disposed underneath the light-scattering surface 628 in this embodiment to increase light energy emitting from the light-emitting surface 624.

In addition, the backlight module 600 may further comprise a reflective mask 640 that masks the light incident surface 626 of the light-guiding element 620 and the LED package structure 500 because they are attached on an inner surface of the reflective mask 640. As a result, the light from the backlight module LED package structure 500, even though may not be directly transmitted into the light incident surface 626, will be reflected via the reflective mask 640, via the light-guiding element 620's light incident surface 626 and finally into the light-guiding element 620.

In summary, the LED package structure of the present invention can respectively provide light-converging and light-scattering functions in all axes; and in comparison with the conventional single LED package structure's light-converging and light-scattering capabilities, the LED package structure of the present invention has a wider application, especially in the field of backlight module. The LED package structure of the present invention implemented as a light-emitting element can not only provide a uniformly light-mixing function in a shorter distance but also reduce the backlight module's size, thus improving light utilization of the backlight module.

Therefore, the backlight module of the present invention has features of a shorter light-mixing distance, small volume, and improved light utilization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting-diode (LED) package structure, comprising:
   a substrate;
   an LED chip, disposed on the substrate;
   a plastic package body, disposed on the substrate and covering the LED chip, wherein the plastic package body comprises a light-converging part and a light-scattering part, the light-converging part comprising a first axis along Y direction, the light-scattering part comprising a second axis along Z direction and the first axis intersecting the second axis, wherein the center point of the light-converging part and the center point of the light-scattering part are at the position where the second axis and the first axis intersect when viewing the plastic package body from a side view along X direction; and
   two leading legs, each of which comprising one terminal electrically connected to the LED chip.

2. The LED package structure of claim 1, wherein a light-emitting surface of the light-converging part inclines relative to the second axis.

3. The LED package structure of claim 2, wherein the light-converging part is of a funnel shape.

4. The LED package structure of claim 1, wherein the light emitting from the light-scattering part is perpendicular to the second axis.

5. The LED package structure of claim 1, wherein a spatial radiation pattern of the light-converging part of the plastic package body is of a Lambertian type.

6. The LED package structure of claim 1, wherein a spatial radiation pattern of the light-converging part of the plastic package body is a Batwing type.

7. The LED package structure of claim 1, wherein the LED chip comprises a red light LED chip, a green light LED chip, or a blue light LED chip.

8. The LED package structure of claim 1, wherein the first axis is perpendicular to the second axis.

9. A backlight module, comprising:
   a light-guiding element, comprising a light incident surface and a light emitting surface;
   a plurality of LED package structures, disposed on a printed circuit board and arranged close to the light incident surface; each LED package structure comprising:
   a substrate;
   an LED chip, disposed on the substrate;
   a plastic package body, disposed on the substrate and covering the LED chip, wherein the plastic package body comprises a light-converging part and a light-scattering part, the light-converging part comprising a first axis along Y direction, the light-scattering part comprising a second axis along Z direction, the first axis being perpendicular to the light-emitting surface of the light-guiding element and the second axis being perpendicular to the light incident surface of the light-guiding element, wherein the center point of the light-converging part and the center point of the light-scattering part are at the position where the second axis and the first axis intersect when viewing the plastic package body from a side view along X direction; and two leading legs, each of which comprising a first terminal electrically connected to the LED chip and a second terminal electrically connected to the printed circuit board.

10. The backlight module of claim 9, wherein the light-emitting surface of the light-converging part inclines relative to the second axis.

11. The backlight module of claim 10, wherein the light-converging part is of a funnel shape.

12. The backlight module of claim 9, wherein the light emitting from the light-scattering part is perpendicular to the second axis.

13. The backlight module of claim 9, wherein a spatial radiation pattern of the light-converging part of the plastic package body is of a Lambertian or a Batwing type.

14. The backlight module of claim 9, wherein the light-guiding element is a light-guiding plate.

15. The backlight module of claim 14, wherein the light-guiding plate is a wedge-shaped light-guiding plate.

16. The backlight module of claim 9, wherein the LED chip comprises a red light LED chip, a green light LED chip, or a blue light LED chip.

17. The backlight module of claim 9, wherein the light-guiding element further comprises a light-scattering surface disposed opposite to the light-emitting surface.

18. The backlight module of claim 17, further comprising a reflective plate disposed underneath the light-scattering surface.

19. The backlight module of claim 9, further comprising a reflective mask that masks the light incident surface of the light-guiding element, which is attached on an inner surface of the reflective mask, wherein the backlight module is disposed between the reflective mask and the light-guiding element.

20. The backlight module of claim 9, wherein the first axis is perpendicular to the second axis.

* * * * *